United States Patent
Solki (10) Patent No.: US 8,278,950 B2
(45) Date of Patent: Oct. 2, 2012

(54) APPARATUS AND METHOD FOR MONITORING CURRENT FLOW TO INTEGRATED CIRCUIT IN TEMPERATURE-COMPENSATED MANNER

(75) Inventor: Shahin Solki, Richmond Hill (CA)

(73) Assignee: ATI Technologies ULC, Markham, Ontario (CA)

( * ) Notice: Subject to any disclaimer, the term of this patent is extended or adjusted under 35 U.S.C. 154(b) by 247 days.

(21) Appl. No.: 12/716,787

(22) Filed: Mar. 3, 2010

(65) Prior Publication Data

US 2011/0215823 A1    Sep. 8, 2011

(51) Int. Cl.
*G01R 27/08*    (2006.01)
*G01R 31/02*    (2006.01)

(52) U.S. Cl. .............. 324/705; 324/713; 324/762.01

(58) Field of Classification Search ........... 324/705, 324/713
See application file for complete search history.

(56) References Cited

U.S. PATENT DOCUMENTS

| | | | |
|---|---|---|---|
| 5,896,025 A * | 4/1999 | Yamaguchi et al. | 320/134 |
| 7,394,271 B2 * | 7/2008 | Lopez et al. | 324/750.03 |
| 7,880,485 B2 * | 2/2011 | Nakamura | 324/705 |
| 7,902,802 B2 * | 3/2011 | Lo et al. | 323/273 |

OTHER PUBLICATIONS

A.A. Hatzopoulos et al., "Current Conveyor Based Test Structures for Mixed-Signal Circuits," University of Waterloo, Downloaded from IEEE Xplore Oct. 28, 2009, pp. 213-217.
J.F. Witte et al., "A Current-Feedback Instrumentation Amplifier with 5uV Offset for Bidirectional High-Side Current-Sensing," 2008 IEEE International Solid-State Circuits Conference, pp. 74, 75 and 596.
Johan F. Witte et al., "A Current-Feedback Instrumentation Amplifier With 5uV Offset for Bidirectional High-Side Current-Sensing," Ieee Journal of Solid-State Circuits, vol. 43, No. 12, Dec. 2008, pp. 2760-2775.
Kimmo Koli et al., "CMRR Enhancement Techniques for Current-Mode Instrumentation Amplifiers," IEEE Transactions on Circuits and Systems-I: Fundamental Thory and Applications, vol. 47, No. 5, May 2000, pp. 622-632.
Cesar A. Prior et al., "Instrumentation Amplifier Using Robust Rail-To-Rail Operational Amplifiers With gm Control,"Universidade Federal de Santa Maria-UFSM, Dowloaded from IEEE Xplore Oct. 10, 2009, pp. 148-152.
Lingchuan Zhou et al., "A 100 MHz Current Conveyor in 0.35 um CMOS Technology," 2007 IEEE International Conference on Signal Processing and Communications (ICSPC 2007), pp. 297-300.

* cited by examiner

*Primary Examiner* — Jeff Natalini
(74) *Attorney, Agent, or Firm* — Faegre Baker Daniels LLP (57) ABSTRACT

A circuit and method for monitoring current flow to an integrated circuit (IC), alone or mounted on a substrate, in a temperature-compensated manner. In accordance with a preferred embodiment, a plurality of resistances having substantially equal temperature coefficients establishes a ratio of an output voltage and an internally measured voltage, with the output voltage corresponding to a voltage drop across an inherent resistance within the IC or on the substrate.

16 Claims, 5 Drawing Sheets

APPARATUS AND METHOD FOR MONITORING CURRENT FLOW TO INTEGRATED CIRCUIT IN TEMPERATURE-COMPENSATED MANNER

FIELD OF THE DISCLOSURE

The present disclosure relates to monitoring power supply current flow, and in particular, to monitoring power supply current flow to integrated circuits at the die or board level.

BACKGROUND OF THE DISCLOSURE

Monitoring power supply current has become an increasingly standard requirement for many circuits and systems, and in particular, for graphics processing units (GPUs), at board or ASIC (Application Specific Integrated Circuit) level. Conventional techniques for monitoring power supply current rely on board level circuits or specially designed voltage regulator modules (VRMs) to provide a signal representing the monitored current. Such signal is often analog in form or digital, e.g., relayed via an I2C (Inter IC) signal bus, as is well known in the art, for the voltage rail for which the current is being monitored (e.g., VCC for bipolar circuits, or VDD or VSS voltages for MOS circuits).

Such conventional techniques are often problematic. For example, such techniques require special or custom board level design or voltage regulator controllers, all of which add to the BOM (Bill Of Material) costs for the overall product and are often impractical for use in a mass production environment. Additionally, static current measurements require calibration, which must be done for each product incorporating the circuitry for which the current is to be monitored (e.g., for each stock keeping unit (SKU) as opposed to the specific ASIC used, which also appears in other products as well). Dynamic current measurement is difficult to calibrate, in many cases impractical, and even after calibration tends to have poor accuracy. Further, such techniques take significant engineering efforts for each and every ASIC released to verify their operation, thereby making their costs prohibitive for incorporation into low and mid-range products.

Additional techniques include using a HALL sensor on the current path or a series sense resistor in the current path. However, HALL sensors must generally be used at the printed circuit board level and tend to be large and costly, and offer limited bandwidth. Series sense resistors are sensitive to variations in device fabrication and temperature, and can potentially reduce the effective voltage of the power supply rail being monitored, as well as increase power consumption and heat dissipation requirements.

Accordingly, it would be desirable to have a technique for monitoring current flow to an IC in a temperature-compensated manner which is not dependent upon individual product designs incorporating the IC to be monitored. Further, or alternatively, it would be desirable to avoid any requirement for adding or using special discrete components, structures or designs within the circuit under test, i.e., to use elements or parameters inherent in the design of the IC being monitored. Further, or alternatively, it would be desirable to have such technique capable of being integrated into the IC, i.e., the die itself, within which the current is to be monitored.

BRIEF DESCRIPTION OF THE DRAWINGS

The embodiments will be more readily understood in view of the following description when accompanied by the below figures and wherein like reference numerals represent like elements, wherein.

DETAILED DESCRIPTION OF THE PREFERRED EMBODIMENTS

A circuit and method are provided for monitoring current flow to an integrated circuit (IC), alone or mounted on a substrate, in a temperature-compensated manner. In accordance with a preferred embodiment, a plurality of resistances having substantially equal temperature coefficients establishes a ratio of an output voltage and an internally measured voltage, with the output voltage corresponding to a voltage drop across an inherent resistance within the IC or on the substrate.

Advantageously, the circuit and method as disclosed herein provide for monitoring current flow to an IC in a temperature-compensated manner which is not dependent upon individual product designs incorporating the IC to be monitored. A further, or alternative, advantage is avoiding any requirement for adding or using special discrete components, structures or designs within the circuit under test, i.e., to use elements or parameters inherent in the design of the IC being monitored. A further, or alternative, advantage is such technique is capable of being integrated into the IC, i.e., the die itself, within which the current is to be monitored.

In accordance with one embodiment, an apparatus including an integrated circuit also includes an integrated circuit (IC) including at least one active device, at least one conductive IC circuit path operably coupled to the at least one active device, at least one IC electrode operably coupled to the at least one conductive IC circuit path for conveying current between an external connection and the at least one active device via the at least one conductive IC circuit path, and voltage measurement circuitry. The voltage measurement circuitry includes a plurality of resistances having substantially equal temperature coefficients, and is operably coupled between the at least one IC electrode and the at least one active device for measuring at least IC electrode and device voltages at the at least one IC electrode and the at least one active device, respectively, to provide a measured voltage related to a voltage difference between the IC electrode and device voltages. The measured voltage is related to a current flowing between the at least one IC electrode and the at least one active device, and a ratio of the measured voltage and the voltage difference between the IC electrode and device voltages is substantially independent from temperature variations.

In accordance with another embodiment, a method for monitoring current flow to an integrated circuit includes measuring at least IC electrode and device voltages at least one IC electrode and at least one active device, respectively, and providing a measured voltage related to a voltage difference between the IC electrode and device voltages. The integrated circuit (IC) includes the at least one active device, at least one conductive IC circuit path operably coupled to the at least one active device, and the at least one IC electrode operably coupled to the at least one conductive IC circuit path for conveying current between an external connection and the at least one active device via the at least one conductive IC circuit path. The measured voltage is related to a current flowing between the at least one IC electrode and the at least one active device, and a ratio of the measured voltage and the voltage difference between the IC electrode and device voltages is substantially independent from temperature variations.

In accordance with another embodiment, a computer readable medium includes a plurality of executable instructions that, when executed by an integrated circuit design system, cause the integrated circuit design system to produce an integrated circuit (IC) including at least one active device, at least one conductive IC circuit path operably coupled to the at least one active device, at least one IC electrode operably coupled to the at least one conductive IC circuit path for conveying current between an external connection and the at least one active device via the at least one conductive IC circuit path, and voltage measurement circuitry. The voltage measurement circuitry includes a plurality of resistances having substantially equal temperature coefficients and is operably coupled between the at least one IC electrode and the at least one active device for measuring at least IC electrode and device voltages at the at least one IC electrode and the at least one active device, respectively, to provide a measured voltage related to a voltage difference between the IC electrode and device voltages. The measured voltage is related to a current flowing between the at least one IC electrode and the at least one active device, and a ratio of the measured voltage and the voltage difference between the IC electrode and device voltages is substantially independent from temperature variations.

The following detailed description is of example embodiments with references to the accompanying drawings. Such description is intended to be illustrative and not limiting. Such embodiments are described in sufficient detail to enable one of ordinary skill in the art to practice the disclosed subject matter, and it will be understood that other embodiments may be practiced with some variations without departing from the spirit or scope of the disclosed subject matter.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

In accordance with embodiments described herein, temperature-compensated current monitoring for an integrated circuit, a substrate on which the integrated circuit is mounted, or both, can be done by monitoring the current delivery paths between: (1) one or more active devices within the IC within the die and one or more of the IC electrodes (e.g., a solder bump of a surface-mounted die such as a flip-chip) responsible for delivering the current; or (2) one or more substrate electrodes (e.g., a solder ball of a ball grid array) responsible for delivering the current and the IC electrode by which the IC is mounted to the substrate. Such evaluation of these current delivery paths includes measuring the voltages at the ends of such paths to determine the voltage drop V between them, which is equal to a product of the resistance R of such current path and the current I flowing through such current path ($V=R*I$).

Figure 1:
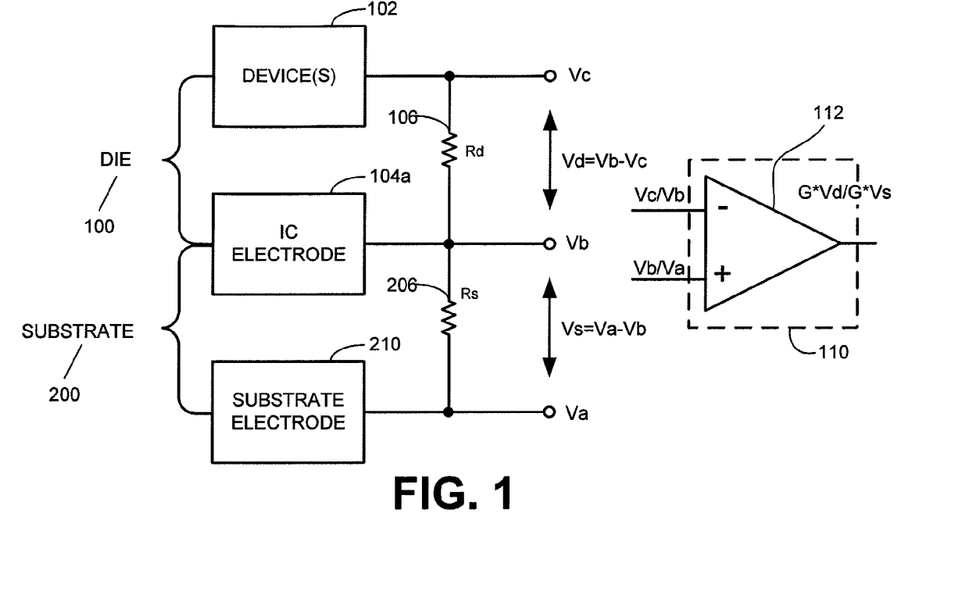
FIG. 1 is a schematic representation depicting temperature-compensated current monitoring for an integrated circuit, a substrate, or both in accordance with one or more preferred embodiments.

Referring to FIG. 1, this can be better understood by realizing that the current delivery path between the substrate electrode 210 and IC electrode 104a has an inherent series resistance Rs 206. Similarly, between the IC electrode 104a and one or more devices 102 within the IC is a current delivery path having an inherent resistance Rd 106. Accordingly, relative to the circuit reference potential, e.g., circuit ground, a voltage Va will appear at the substrate electrode 210, another voltage Vb will appear at the IC electrode 104a and another voltage Vc will appear at the node or electrode connecting the one or more devices 102. These voltages Va, Vb, Vc will be different, albeit slightly, due to the IR (current times resistance) voltage drops across the resistances 206, 106, i.e., Vs=Va−Vb and Vd=Vb−Vc.

With an appropriate voltage measuring circuit 108, e.g., including a temperature-compensated amplifier 110 (discussed in more detail below), these voltage differences Vd, Vs can be measured to provide amplified versions G*Vd, G*Vs of these voltages Vd, Vs which are proportional to the amplifier gain G.

Figure 2:
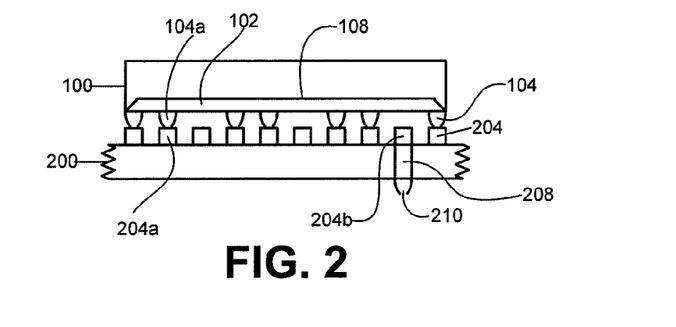
FIG. 2 depicts a side view of an integrated circuit, such as a flip-chip, mounted on a substrate.

Referring to FIG. 2, one example of a situation in which this technique is particularly useful is that of the mating of a surface-mounted IC 100, e.g., a flip-chip, and a substrate 200, e.g., including a ball grid array (BGA). Such a combination of ICs and substrate are well known in the art and are often used for mounting multiple ICs on a single substrate for more dense packaging of circuits. As is well known in the art, circuitry 108, including the one or more active devices 102, is integrated within the top surface of the IC 100, following which electrodes 104 are deposited for allowing the IC 100 to be inverted and mounted directly to the surface of a substrate 200 via electrical and mechanical connections afforded by the IC electrodes 104 and corresponding substrate electrodes 204. For example, in accordance with a technique well known in the art, the IC electrodes are solder bumps and the substrate electrodes 204 are conductive traces on the top surface of the substrate 200 and are formed of one or more metals which are compatible with the solder bumps 104 such that, after the IC 100 and substrate 200 are placed in mechanical contact and sufficient heat is applied, the solder bumps 104 electrically and mechanically bond with the metal traces 204.

As is well known in the art, such ICs 100 and substrates 200 can be implemented in many different forms to perform many different functions suitable for incorporation into or use with many types of higher level apparatuses, including, but not limited to, central processing units (CPUs), graphics processing units (GPUs), video processors, or other suitable circuits or systems, which, in turn can be incorporated into or used with high definition televisions, computer systems and displays, handheld devices, printers, or other suitable electronic systems.

Particularly of interest, is the current path between the IC electrode 104a and substrate electrode 210 (FIG. 1) through which the currents of interest will flow. As discussed in more detail below, during operation of the circuitry, current arrives via the substrate electrode 210 from a power source (not shown) and is conveyed through a metal via 208 to a current path 206 having substrate contacts 204a, 204b as its end points, such that one contact 204b conveys the incoming current from the substrate electrode 210 and via 208, and the other contact 204a conveys the current to the IC electrode 104a to which it is conductively bonded.

Figure 3:
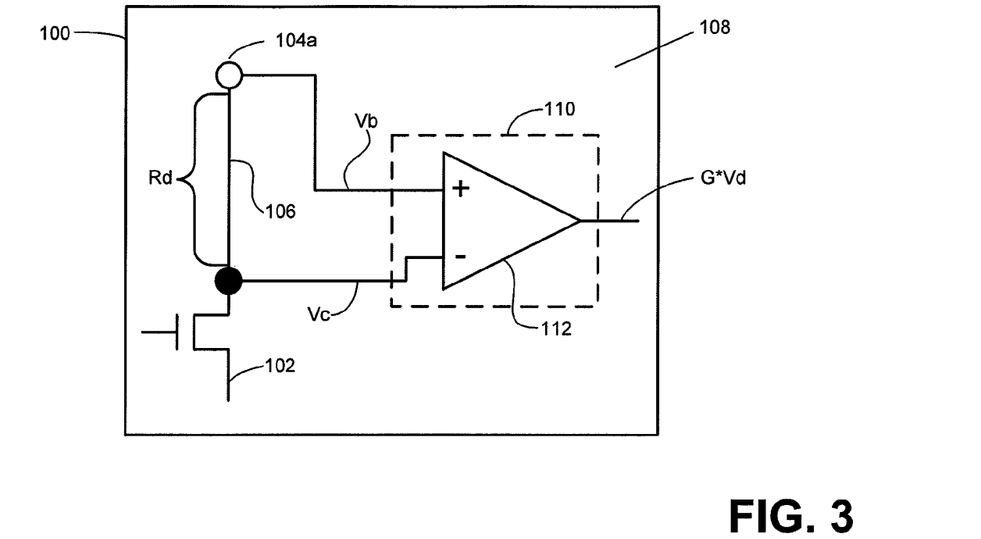
FIG. 3 depicts one implementation of the current monitoring of FIG. 1 in accordance with one embodiment.

Referring to FIG. 3, this can be better understood by visualizing plan views of the IC 100 and substrate 200. As discussed above, the first substrate contact 204b conveys the incoming current from the bottom substrate electrode 210 and via 208 to the current path 206 (having inherent resistance Rs) through which the current flows to the second substrate contact 204a. As also discussed above, this results in the two different voltages Va, Vb in accordance with the amount of current I flowing through the current path 206.

The current is further conveyed via the IC electrode 104a to the IC current path 106 (having inherent resistance Rd) to the one or more devices 102. The voltage measurement circuitry 110, preferably integrated within the integrated circuit 108, can be operably coupled to the IC electrode 104a and one or more devices 102 to measure the resulting voltages Vb, Vc across the inherent resistance Rd, as discussed above.

Figure 4:
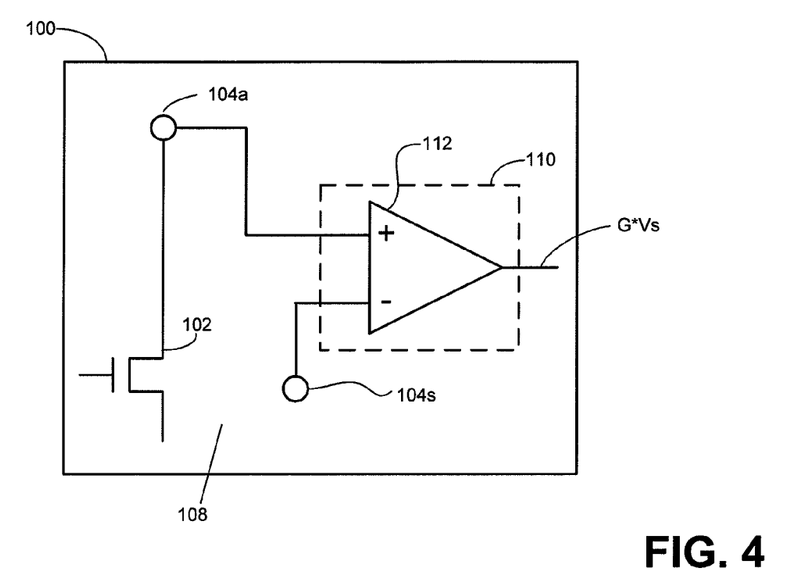
FIG. 4 depicts another implementation of the current monitoring of FIG. 1 in accordance with another embodiment.

Referring to FIG. 4, alternatively, the voltage measurement circuitry 110 can be operably coupled to measure the voltage difference Vs across the inherent resistance Rs of the substrate current path 206. This can be accomplished by coupling one of the voltage measurement circuitry inputs to the IC electrode 104a and the other input to the substrate electrode 204b via an additional IC electrode 104s, substrate electrode 204s and substrate current path 216, as shown. As will be readily understood by one of ordinary skill in the art, the input impedances of the voltage measurement circuitry 110 will be sufficiently high as to draw negligible currents. Accordingly, any voltage losses, due to any inherent resistances of the additional electrodes 104s, 204s and current path 216, will be negligible.

Figure 5:
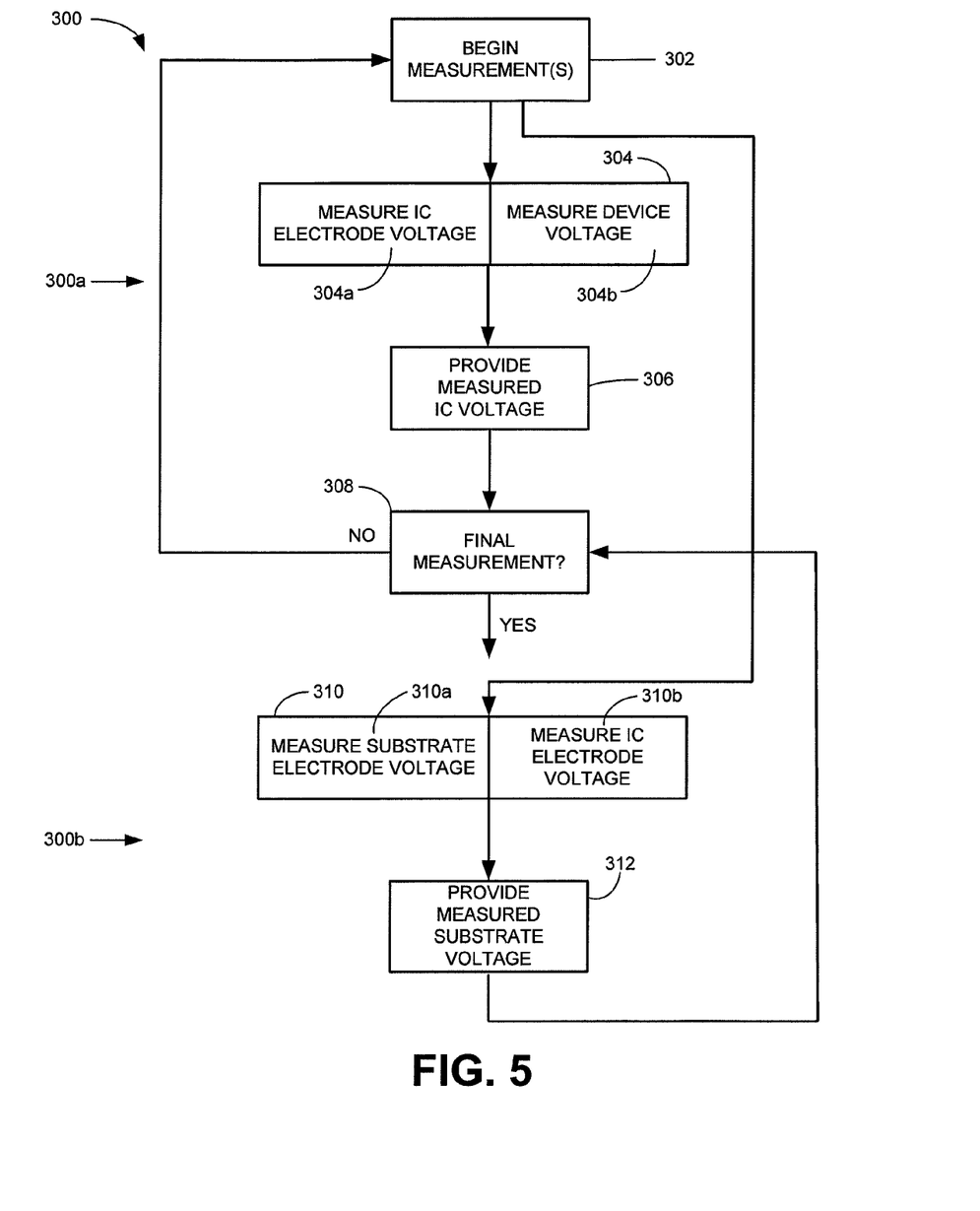
FIG. 5 depicts the voltage measurements for current monitoring as depicted in FIG. 1 in accordance with one or more embodiments.

Referring to FIG. 5, the methodology of the voltage measurements discussed above can be visualized as shown. Further, in accordance with the discussions above for FIGS. 3 and 4 in particular, it should be readily understood that the measurement methodology can include measurements for either the voltage drop for the IC within the die, i.e., Vd, or the substrate voltage drop, i.e., Vs, or both, can be performed. While shown generally as item 300, the steps for the die voltage drop Vd generally include portion 300a, while the steps for the substrate voltage drop Vs generally include portion 300b.

Initially, the one or more measurements are begun 302, following which one or both of the voltage measurements can be performed, either in a sequentially or simultaneously. For measuring the die voltage drop Vd, the IC electrode voltages are measured 304a and the device voltage is measured 304b. These measurement steps 304a, 304b can also be done simultaneously 304. Following that, the measured IC voltages are provided 306 based on the difference between the IC electrode voltage and device voltage, as discussed above. Following that, a determination is made as to whether that is the final measurement. If not, the process is repeated 302.

Similarly, for the substrate voltage drop Vs, the substrate electrode voltage is measured 310a and the IC electrode voltage 310b is measured. As in the case of the IC voltage drop Vd, these steps 310a, 310b can be performed simultaneously 310. Following that, the measured substrate voltage Vs is provided 312. Again, a determination is made as to whether this is a final measurement 308. If not, the measurements are repeated 302.

It will be readily appreciated by one of ordinary skill in the art that these tests can be performed simultaneously using multiple implementations of the voltage measurement circuitry 110 (FIG. 1). Alternatively, these measurements can be performed sequentially by using a single voltage measurement circuit 110 and well known switching circuitry (not shown), e.g., pass transistors or transmission gate circuits as are well known in the art, for selectively coupling the inputs of the voltage measurement circuitry 110 to the appropriate points of measurement 102, 104a, 210.

Figure 6:
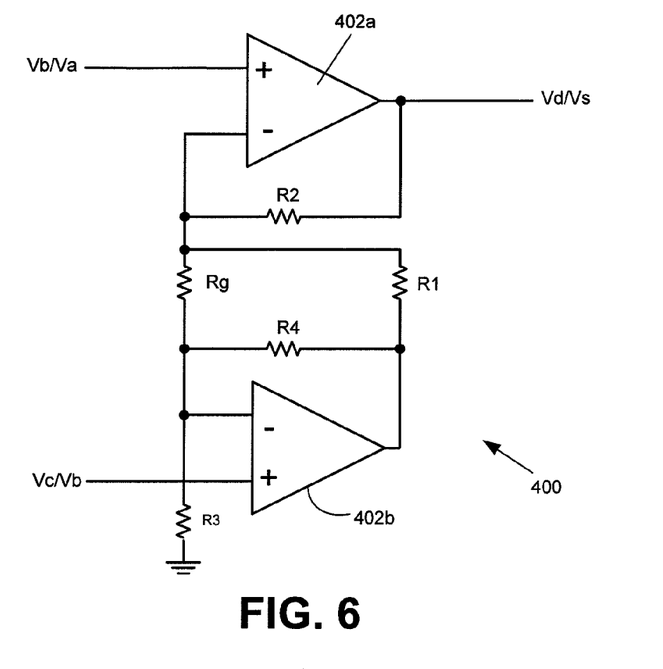
FIG. 6 is a schematic representation of an exemplary embodiment of a voltage measurement circuit for use in current monitoring as depicted in FIG. 1.

Referring to FIG. 6, in accordance with one possible embodiment, the voltage measurement circuitry 110 (FIG. 1) can be implemented as shown 400, with differential amplifiers 402a, 402b (e.g., operational amplifiers) and resistances Rg, R1, R2, R3, R4, all interconnected substantially as shown. As discussed in more detail below, this amplifier configuration 400 provides a voltage gain G, which is a function of temperature T, i.e., G(T). This gain is used to amplify the small voltage drops Vs, Vd across the inherent resistances Rs, Rd, as discussed above.

Each inherent resistance can be considered as the variable R, which is a function of the geometry and effective temperature coefficient of the materials used to fabricate such resistance R. Once the package has been designed, this material and the geometries are no longer variable, with the exception of fabrication tolerances. However, this resistance R will be a function of temperature T, and can be written as:

$$R(T) = R0(1 + \text{Coeff}(T - T0))$$

where R0 is the resistance at temperature T0 and Coeff is the equivalent temperature coefficient in percent per degrees Centigrade. Resistive circuit elements suitable for use as these resistances Rg, R1, R2, R3, R4 are well known in the art and commercially available.

For purposes of the following discussion, a linear temperature coefficient is presumed to explain the temperature compensation. However, it will be readily understood by one of ordinary skill in the art that higher order temperature coefficients can be accommodated.

For example, a typical increase in GPU junction temperature from static screening to a running application can easily reach approximately 40° C. (e.g., ranging from 50° C. to 90° C.). With copper generally being the currently dominant material for IC metallization, a temperature coefficient of 0.39% per degree Centigrade can cause inherent resistance increases of 16%. Accordingly, if current measurements are not thermally compensated, large errors will be introduced as follows (where t is time) due to the following relationship of the change in voltage ΔV due to the variation in the resistance R(T) as a function of temperature:

$$\Delta V = I(t) * R(T)$$

Since the inherent resistance R is very small (e.g., in the range of milliohms), the change in voltage ΔV is also very small (e.g., in the range of millivolts), thereby requiring amplification, as discussed above. The characteristics of the amplifier, such as thermal drift, input and output voltage offsets, etc., will affect the overall accuracy of the circuit. In the case of an instrumentation amplifier, such as that shown in FIG. 6, with a gain of G(T), the equation above can be rewritten as follows:

$$\Delta V * G(T) = G * I(t) * R(T)$$

For local current sensing, as discussed above, the amplifier gain G(T) can be designed to be a function of temperature using a positive temperature coefficient. First, the resistances are R1, R2, R3, R4 are established with absolute and mutually relative values as follows:

$$R1 = R2 = R$$

$$R3 = R4$$

Using these resistance values, it can be easily shown that the gain G of the amplifier circuit (neglecting temperature) can be expressed as follows:

$$G = 2*(1 + R/Rg)$$
$$= 2R/Rg \text{ for } G \gg 1$$

This circuit can then be thermally compensated by selecting an appropriate gain resistance Rg for the desired gain, for which its resistance as a function of temperature can be expressed as follows:

$$Rg(T) = Rg0(1 + \text{Coeff}(T-T0))$$

Accordingly, the amplified voltage difference can be expressed as follows:

$$\Delta V * G(T) = G(T) * I(t) * R(T)$$
$$= 2R/Rg * I(t) * R(T)$$
$$= 2R * I(t) * R(T)/Rg(T)$$

Substituting the temperature dependency relationships for the resistances, the relationship between the inherent resistance R(T) and gain resistance Rg(T) can be expressed as follows:

$$R(T)/Rg(T) = [R0*(1 + \text{Coeff}(T - T0))]/$$
$$[Rg0*(1 + \text{Coeff}(T - T0))]$$
$$= R0/Rg0$$

Substituting this result into the equation for the amplified voltage difference, produces the following:

$$\Delta V * G(T) = 2R * R0/Rg0 * I(t)$$
$$= Kr * I(t)$$

As can be seen from this expression, the amplified voltage difference is independent from temperature variations.

In some instances, such an instrumentation amplifier as depicted in FIG. 6 may provide inadequate performance due to insufficient bandwidth, thereby producing large gain variations when operated over a wide frequency range. Accordingly, other forms of voltage measurement circuitry may be desirable.

Figure 7:
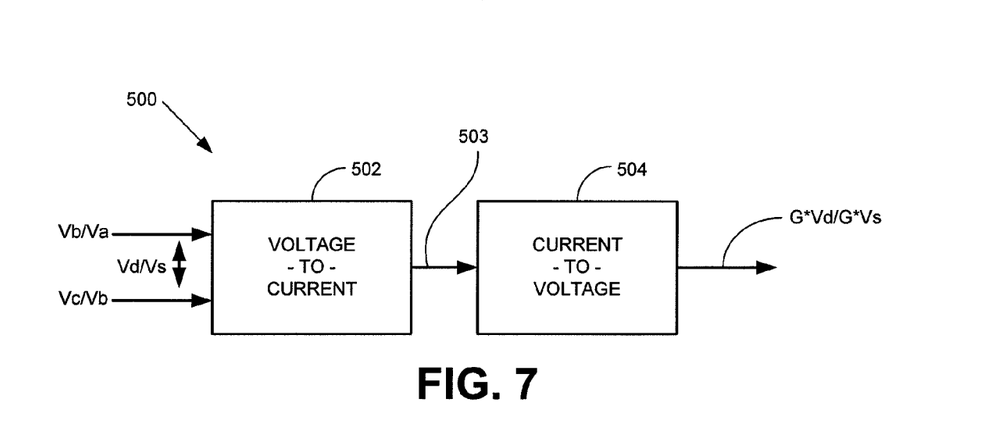
FIG. 7 is a block diagram depicting an alternative embodiment of voltage measurement circuitry suitable for use in current monitoring as depicted in FIG. 1.

Referring to FIG. 7, in general, a desirable form of voltage measurement circuitry 500 would include a voltage-to-current conversion stage 502 followed by a current-to-voltage stage 504. The voltage difference Vd, Vs being measured would be converted to a current signal 503, which, in turn, would then be converted to the amplified voltage signal. As will be readily apparent to one of ordinary skill in the art, these conversion stages 502, 504 can be designed so as to produce a gain factor G dependent upon a ratio or circuit elements having similar temperature coefficients, thereby resulting in temperature compensation, as discussed above.

Figure 8:
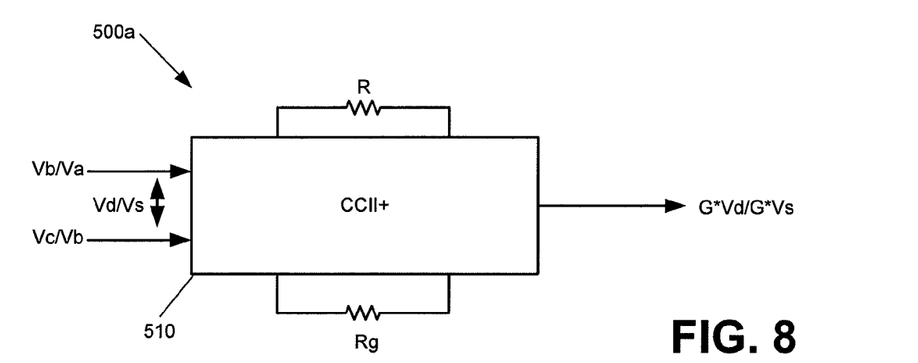
FIG. 8 is a functional block diagram depicting a preferred embodiment of voltage measurement circuitry for current monitoring as depicted in FIG. 1.

Referring to FIG. 8, in accordance with a preferred embodiment, the voltage measurement circuitry 500 of FIG. 7 is preferably implemented as a current conveyer 510, many implementations of which are well known in the art. Such a current conveyer 510 can be designed with circuit elements, e.g., equivalent to the gain-setting resistances R, Rg discussed above, having similar temperature coefficients and from which a ratio determines the gain G and compensates for temperature variations.

Also, integrated circuit design systems (e.g., work stations with digital processors) are known that create integrated circuits based on executable instructions stored on a computer readable medium including memory such as but not limited to CDROM, RAM, other forms of ROM, hard drives, distributed memory, or any other suitable computer readable medium. The instructions may be represented by any suitable language such as but not limited to hardware descriptor language or other suitable language. The computer readable medium contains the executable instructions that when executed by the integrated circuit design system causes the integrated circuit design system to produce an integrated circuit that includes the circuitry as set forth above. The code is executed by one or more processing devices in a work station or system (not shown). As such, the logic (e.g., circuits) described herein may also be produced as integrated circuits by such integrated circuit systems executing the instructions.

Various other modifications and alternations in the structure and method of operation of this disclosed subject matter will be apparent to those skilled in the art. Although the disclosed subject matter has been described in connection with specific preferred embodiments, it should be understood that the disclosed subject matter should not be unduly limited to such specific embodiments. It is intended that the following claims define the scope and that structures and methods within the scope of these claims and their equivalents be covered thereby.

What is claimed is:

1. An apparatus comprising:
   an integrated circuit (IC) including:
      at least one active device,
      at least one conductive IC circuit path operably coupled to said at least one active device,
      at least one IC electrode operably coupled to said at least one conductive IC circuit path for conveying current between an external connection and said at least one active device via said at least one conductive IC circuit path, and
      voltage measurement circuitry, including a plurality of resistances having substantially equal temperature coefficients, operably coupled between said at least one IC electrode and said at least one active device for measuring at least IC electrode and device voltages at said at least one IC electrode and said at least one active device, respectively, to provide a measured voltage related to a voltage difference between said IC electrode and device voltages;
   wherein
      said measured voltage is related to a current flowing between said at least one IC electrode and said at least one active device, and
      a ratio of said measured voltage and said voltage difference between said IC electrode and device voltages is temperature compensated.

2. The apparatus of claim 1, wherein said IC comprises a surface-mountable chip and said at least one IC electrode comprises at least one solder bump.

3. The apparatus of claim 1, wherein said voltage measurement circuitry comprises current conveyor circuitry.

4. The apparatus of claim 1, wherein said measured voltage corresponds to a voltage drop across an inherent resistance between said at least one IC electrode and said at least one active device.

5. The apparatus of claim 1, wherein said ratio of said measured voltage and said voltage difference between said IC electrode and device voltages is substantially proportional to a ratio of first and second portions of said plurality of resistances.

6. The apparatus of claim 1, further comprising a circuit substrate including at least one conductive substrate circuit path with at least one substrate electrode, wherein said IC is operably coupled to said at least one conductive substrate circuit path via said at least one IC electrode for conveying said current between said external connection and said at least one active device via said at least one conductive substrate circuit path, wherein said voltage measurement circuitry is operably coupled between at least two respective ones of each of said at least one conductive substrate circuit path, said at least one IC electrode and said at least one active device for measuring at least two respective ones of substrate electrode, IC electrode and device voltages at said at least one substrate electrode, said at least one IC electrode and said at least one active device, respectively, to provide at least one of
    a measured substrate voltage related to a voltage difference between said substrate and IC electrode voltages, and
    a measured IC voltage related to a voltage difference between said IC electrode and device voltages;
wherein
    said provided at least one of said measured substrate and IC voltages is related to a current flowing between said at least one substrate electrode and said at least one IC electrode and between said at least one IC electrode and said at least one active device, respectively,
    a ratio of said measured substrate voltage and said voltage difference between said substrate and IC electrode voltages is temperature compensated, and
    a ratio of said measured IC voltage and said voltage difference between said IC electrode and device voltages is temperature compensated.

7. The apparatus of claim 6, wherein said circuit substrate comprises a ball grid array (BGA) and said at least one substrate electrode comprises at least one BGA ball.

8. The apparatus of claim 6, wherein said measured voltage corresponds to at least one voltage drop across a corresponding inherent resistance between said at least one substrate electrode and said at least one IC electrode and between said at least one IC electrode and said at least one active device.

9. The apparatus of claim 6, wherein:
said ratio of said measured substrate voltage and said voltage difference between said substrate and IC electrode voltages is substantially proportional to a ratio of first and second portions of said plurality of resistances; and
said ratio of said measured IC voltage and said voltage difference between said IC electrode and device voltages is substantially proportional to said ratio of first and second portions of said plurality of resistances.

10. A method for monitoring current flow to an integrated circuit, comprising:
measuring at least IC electrode and device voltages at at least one IC electrode and at least one active device, respectively; and
providing a measured voltage related to a voltage difference between said IC electrode and device voltages;
wherein
    said integrated circuit (IC) includes
        said at least one active device,
        at least one conductive IC circuit path operably coupled to said at least one active device, and
        said at least one IC electrode operably coupled to said at least one conductive IC circuit path for conveying current between an external connection and said at least one active device via said at least one conductive IC circuit path,
    said measured voltage is related to a current flowing between said at least one IC electrode and said at least one active device, and
    a ratio of said measured voltage and said voltage difference between said IC electrode and device voltages is temperature compensated.

11. The method of claim 10, wherein said measured voltage corresponds to a voltage drop across an inherent resistance between said at least one IC electrode and said at least one active device.

12. The method of claim 10, wherein said ratio of said measured voltage and said voltage difference between said IC electrode and device voltages is substantially proportional to a ratio of first and second portions of said plurality of resistances.

13. The method of claim 10, wherein:
said measured substrate voltage corresponds to a voltage drop across an inherent resistance between said substrate and IC electrodes, and
said measured IC voltage corresponds to another voltage drop across another inherent resistance between said at least one IC electrode and said at least one active device.

14. The method of claim 10, wherein:
said ratio of said measured substrate voltage and said voltage difference between said substrate and IC electrode voltages is substantially proportional to a ratio of first and second portions of said plurality of resistances; and
said ratio of said measured IC voltage and said voltage difference between said IC electrode and device voltages is substantially proportional to said ratio of first and second portions of said plurality of resistances.

15. A tangible computer readable medium comprising a plurality of executable instructions that, when executed by an integrated circuit design system, cause the integrated circuit design system to produce:
an integrated circuit (IC) including
    at least one active device,
    at least one conductive IC circuit path operably coupled to said at least one active device,
    at least one IC electrode operably coupled to said at least one conductive IC circuit path for conveying current between an external connection and said at least one active device via said at least one conductive IC circuit path, and
    voltage measurement circuitry, including a plurality of resistances having substantially equal temperature coefficients, operably coupled between said at least one IC electrode and said at least one active device for measuring at least IC electrode and device voltages at said at least one IC electrode and said at least one active device, respectively, to provide a measured voltage related to a voltage difference between said IC electrode and device voltages;
wherein
said measured voltage is related to a current flowing between said at least one IC electrode and said at least one active device, and
a ratio of said measured voltage and said voltage difference between said IC electrode and device voltages is temperature compensated.

16. The computer readable medium of claim 15, wherein the plurality of executable instructions that, when executed by the integrated circuit design system, further cause the integrated circuit design system to produce the IC such that:
said voltage measurement circuitry is operably coupled between at least two respective ones of each of at least another IC electrode for coupling to at least one conductive substrate circuit path, said at least one IC electrode and said at least one active device for measuring at least two respective ones of substrate electrode, IC electrode and device voltages at said at least one substrate electrode, said at least one IC electrode and said at least one active device, respectively, to provide at least one of
a measured substrate voltage related to a voltage difference between said substrate and IC electrode voltages, and
a measured IC voltage related to a voltage difference between said IC electrode and device voltages;
wherein
said provided at least one of said measured substrate and IC voltages is related to a current flowing between said at least one substrate electrode and said at least one IC electrode and between said at least one IC electrode and said at least one active device, respectively,
a ratio of said measured substrate voltage and said voltage difference between said substrate and IC electrode voltages is temperature compensated, and
a ratio of said measured IC voltage and said voltage difference between said IC electrode and device voltages is temperature compensated.

* * * * *